US009739841B2

(12) United States Patent
Berroteran Gil et al.

(10) Patent No.: US 9,739,841 B2
(45) Date of Patent: Aug. 22, 2017

(54) AUTOMATED METHOD AND APPARATUS FOR TESTING A POWER CONVERTER

(71) Applicant: General Electric Company, Schenectady, NY (US)

(72) Inventors: Igor Berroteran Gil, Salem, VA (US); Anthony Michael Klodowski, Hardy, VA (US); David Smith, Daleville, VA (US)

(73) Assignee: General Electric Company, Schenectady, NY (US)

( * ) Notice: Subject to any disclaimer, the term of this patent is extended or adjusted under 35 U.S.C. 154(b) by 524 days.

(21) Appl. No.: 14/260,586

(22) Filed: Apr. 24, 2014

(65) Prior Publication Data

US 2015/0309119 A1    Oct. 29, 2015

(51) Int. Cl.
*G01R 31/42* (2006.01)
*H02S 50/10* (2014.01)
(Continued)

(52) U.S. Cl.
CPC ............ *G01R 31/42* (2013.01); *H02M 1/126* (2013.01); *H02M 7/219* (2013.01);
(Continued)

(58) Field of Classification Search
CPC . G01R 31/34; H02H 7/10; H02H 3/20; H02H 3/05
(Continued)

(56) References Cited

U.S. PATENT DOCUMENTS

| 7,978,445 B2 | 7/2011 | Ritter |
| 2001/0002111 A1* | 5/2001 | Isobe ..................... G01R 31/26 327/323 |

(Continued)

FOREIGN PATENT DOCUMENTS

WO    WO 2011/082855    7/2011

OTHER PUBLICATIONS

Kim et al., Grid-Tied Power Converter for Battery Energy Storage Composed of 2-Stage DC-DC Converter, Journal of Electrical Engineering & Technology, vol. 8, No. 6, Nov. 2013, pp. 742-750.
(Continued)

*Primary Examiner* — Jermele M Hollington
*Assistant Examiner* — Christopher McAndrew
(74) *Attorney, Agent, or Firm* — Dority & Manning, P.A.

(57) ABSTRACT

A method and apparatus for testing operability of a power converter with an existing power conversion assembly of a renewable energy system is disclosed. The method includes transferring a first pulse of energy from an existing power conversion assembly to a power filter of the power converter through first cells within a bridge circuit of the power converter. Another step includes determining a first current-voltage feedback associated with the first pulse. A next step includes transferring a second pulse of energy from the power filter to the existing power conversion assembly through second cells within the bridge circuit such that a portion of the first pulse moves back to the existing power conversion assembly. Another step includes determining a second current-voltage feedback associated with the second pulse. The first and second current-voltage feedbacks are compared with nominal tolerances of the power converter to ensure the power converter is operating properly.

17 Claims, 9 Drawing Sheets

(51) Int. Cl.
*H02M 1/12* (2006.01)
*H02M 7/219* (2006.01)
*H02M 7/5387* (2007.01)
*H02H 3/05* (2006.01)
*G01R 31/34* (2006.01)
*H02H 7/10* (2006.01)
*H02H 3/20* (2006.01)
*H02H 3/18* (2006.01)
*F03D 17/00* (2016.01)

(52) U.S. Cl.
CPC ........... *H02M 7/5387* (2013.01); *H02S 50/10* (2014.12); *F03D 17/00* (2016.05); *F05B 2220/706* (2013.01); *G01R 31/34* (2013.01); *H02H 3/05* (2013.01); *H02H 3/18* (2013.01); *H02H 3/20* (2013.01); *H02H 7/10* (2013.01); *Y02E 10/76* (2013.01)

(58) Field of Classification Search
USPC ..................................................... 324/764.01
See application file for complete search history.

(56) References Cited

U.S. PATENT DOCUMENTS

| | | | |
|---|---|---|---|
| 2010/0103567 A1* | 4/2010 | Saeck | H02M 1/32 361/18 |
| 2012/0013284 A1* | 1/2012 | Campbell | H02H 7/08 318/490 |
| 2012/0053750 A1 | 3/2012 | Viassolo et al. | |
| 2012/0187883 A1* | 7/2012 | Valdez | H02M 1/126 318/490 |
| 2013/0258530 A1* | 10/2013 | Nakahara | G01R 19/16571 361/18 |
| 2014/0327995 A1* | 11/2014 | Panjwani | H02H 3/05 361/93.1 |
| 2014/0362479 A1* | 12/2014 | Park | H02M 1/32 361/18 |

OTHER PUBLICATIONS

Co-pending U.S. Appl. No. 14/136,018, filed Dec. 20, 2013.

\* cited by examiner

AUTOMATED METHOD AND APPARATUS FOR TESTING A POWER CONVERTER

FIELD OF THE INVENTION

The present disclosure relates generally to renewable energy power systems and, more particularly, to an automated method and apparatus for testing a power converter for use in a renewable energy power system, such as a wind turbine.

BACKGROUND OF THE INVENTION

Renewable energy power systems, such as wind energy power systems and solar energy power systems, often include a power converter with a regulated DC link. For example, wind power systems, such as wind driven doubly-fed induction generator (DFIG) systems or full power conversion systems, can include a power converter with an AC-DC-AC topology. Solar power systems can include a power converter that has a DC-DC-AC topology.

An energy storage system can be coupled to the DC link of a power converter in a renewable energy system. The energy storage system can be used, for instance, to apply power to the DC link of the power converter during transient conditions. A switching power supply can be provided to transfer energy back and forth between the DC link of the power converter and the energy storage device. For instance, the switching power supply can include a DC-DC power converter configured to convert a first voltage on the DC link to a second voltage at the energy storage device, and vice versa. It can be desirable for the switching power supply to be bi-directional to allow not only for power flow from the energy storage device to the DC link during transient conditions but also to allow power flow from the DC link to the energy storage device, for instance, to charge the energy storage device.

Certain switching power supplies, however, may have complex systems built around a certain topology, e.g. a DC-DC power converter. For example, standard DC-DC power converters may include a bridge circuit and a power filter. In certain embodiments, the power filter may also include a crowbar circuit. In addition, the bridge circuit typically includes a plurality of cells, for example, one or more power switching elements and/or one or more diodes. Thus, interconnection and characteristics of the components of the power converter need to be tested to ensure proper performance of the converter and proper connection with the energy storage system. In addition, in various instances, the converter and its components may need to be re-tested, which can be time-consuming and expensive. Such instances may include, for example, after troubleshooting a malfunction in the power converter, after repairing the power converter, or after subjecting the power converter to one or more structural modifications.

Accordingly, a method and apparatus that addresses the aforementioned problems would be welcomed in the technology. More specifically, a method and apparatus that automatically tests various electrical components of the power converter to ensure proper connection between the power converter and an existing power conversion assembly would be desired in the art.

BRIEF DESCRIPTION OF THE INVENTION

Aspects and advantages of the invention will be set forth in part in the following description, or may be obvious from the description, or may be learned through practice of the invention.

In one aspect, the present subject matter is directed to a method for testing operability of a power converter with an existing power conversion assembly of a renewable energy system. The power converter has a bridge circuit and a power filter. The method includes a step of transferring, by the existing power conversion assembly, a first pulse of energy from the existing power conversion assembly to the power filter through one or more first cells within the bridge circuit. Still an additional step includes determining, by the converter controller, a first current-voltage feedback associated with the first pulse of energy. Another step includes transferring, by the existing power conversion assembly, a second pulse of energy from the power filter to the existing power conversion assembly through one or more second cells within the bridge circuit such that at least a portion of the first pulse of energy within the power filter moves back to the existing power conversion assembly. A next step includes determining, by the converter controller, a second current-voltage feedback associated with the second pulse of energy. Thus, the method also includes comparing, by the converter controller, the first and second current-voltage feedbacks with nominal tolerances of the power converter to ensure that the power converter is operating properly (i.e. within the nominal tolerances).

In another aspect, the present subject matter is directed to a method for coupling one or more energy storage devices to an existing power conversion assembly of a renewable energy system via a power converter. The power converter has a bridge circuit and a power filter. The method includes implementing, by a converter controller, a test sequence for testing operability of the power converter with the existing power conversion assembly. The test sequence includes a step of transferring, by the existing power conversion assembly, a first pulse of energy from the existing power conversion assembly to the power filter through one or more first cells within the bridge circuit. Another step of the test sequence includes determining, by the converter controller, a first current-voltage feedback associated with the first pulse of energy. A further step includes transferring, by the existing power conversion assembly, a second pulse of energy from the power filter to the existing power conversion assembly through one or more second cells within the bridge circuit such that at least a portion of the first pulse of energy within the power filter moves back to the existing power conversion assembly. The test sequence also includes determining, by the converter controller, a second current-voltage feedback associated with the second pulse of energy. Another step includes comparing, by the converter controller, the first and second current-voltage feedbacks with nominal tolerances of the power converter to ensure that the power converter is operating properly. The method also includes electrically coupling one or more energy storage devices with the power converter when the first and second current-voltage feedbacks are within the nominal tolerances.

In yet a further aspect, the present subject matter is directed to an automated apparatus for testing operability of a power converter with an existing power conversion assembly of a renewable energy system. The apparatus includes a power converter electrically coupled to an existing power conversion assembly and a controller communicatively coupled to the power converter and the existing power conversion assembly. The power converter includes a bridge circuit and a power filter. The bridge circuit includes one or more first cells and one or more second cells. The controller is configured to perform a plurality of operations of the power converter and the existing power conversion assembly as described herein. For example, in one embodiment, the operations include: transferring a first pulse of energy from the existing power conversion assembly to the power filter through one or more first cells within the bridge circuit; determining a first current-voltage feedback associated with the first pulse of energy; transferring a second pulse of energy from the power filter to the existing power conversion assembly through one or more second cells within the bridge circuit such that at least a portion of the first pulse of energy within the power filter moves back to the existing power conversion assembly; determining a second current-voltage feedback associated with the second pulse of energy; and, comparing the first and second current-voltage feedbacks with nominal tolerances of the power converter to ensure that the power converter is operating properly (i.e. within the nominal tolerances).

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which.

DETAILED DESCRIPTION OF THE INVENTION

Figure 1:
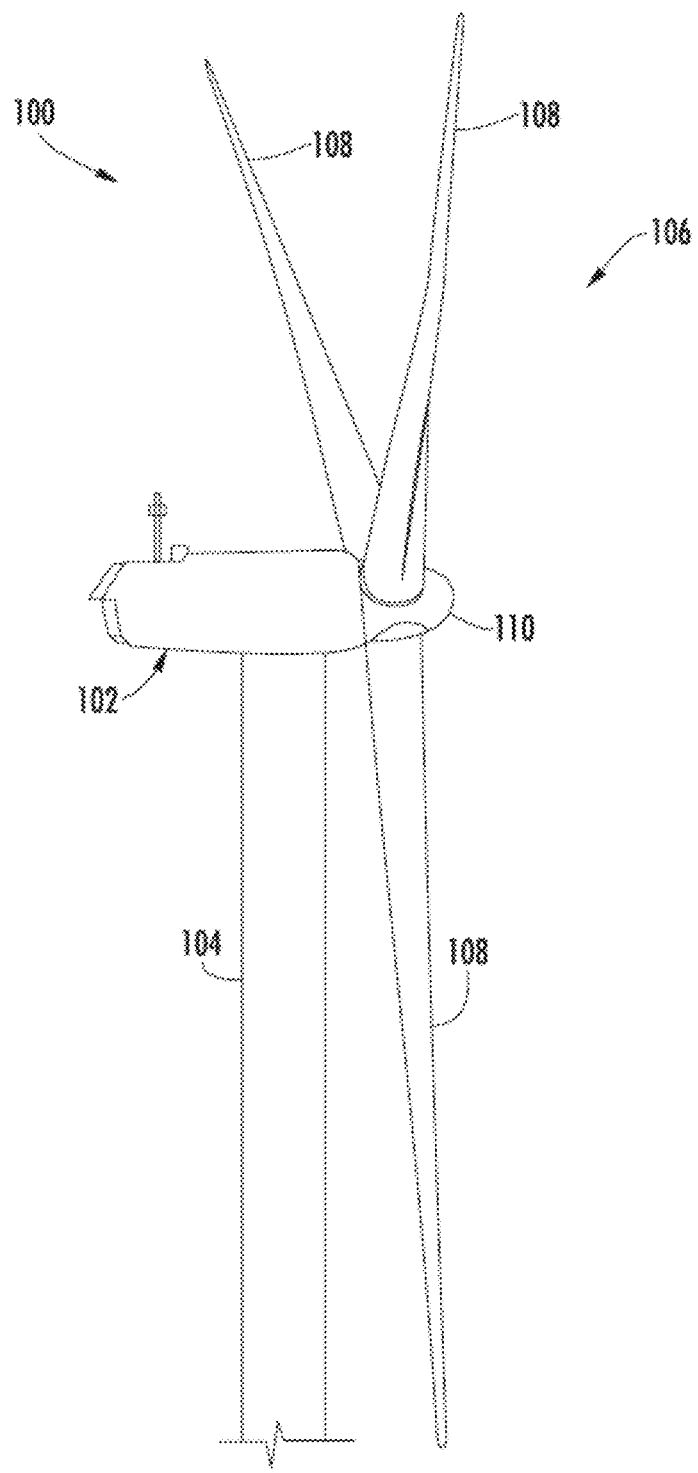
FIG. 1 illustrates a perspective view of a portion of one embodiment of a wind turbine according to the present disclosure.

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

In general, the present subject matter is directed to an automated apparatus and method for testing operability of a power converter, e.g. a DC-DC power converter, with an existing power conversion assembly of a renewable energy system, e.g. a wind turbine, during installation and/or during normal operation. In certain embodiments, the power converter includes a bridge circuit, a breaker, and a power filter. The bridge circuit typically includes a plurality of diodes and a plurality of switching elements (e.g. Insulated-Gate Bipolar Transistors (IGBTs)). The power filter typically includes an inductive element, a resistive element, and a capacitive element. In one embodiment, the power converter is coupled to an existing power conversion assembly of the energy system via a DC link. Thus, the apparatus is configured to transfer a first pulse of energy from the DC link to the inductive element of the power filter through a first IGBT within the bridge circuit. The apparatus then implements a first non-gating interval through a first diode within the bridge circuit such that a portion of the first pulse of energy is directed from the inductive element into the capacitive element of the power filter. The apparatus determines a first current-voltage feedback (e.g. a charge or a flux) associated with the first pulse of energy. Next, the apparatus transfers a second pulse of energy from the DC link through a second IGBT within the bridge circuit such that a portion of the first pulse of energy moves from the capacitive element of the power filter back to the inductive element. The apparatus then implements a second non-gating interval through a second diode of the bridge circuit such that at least a portion of the second pulse of energy returns to the DC link. Next, the apparatus determines a second current-voltage feedback associated with the second pulse of energy. Thus, the apparatus is configured to compare the first and second current-voltage feedbacks with nominal tolerances of the power converter to ensure that the power converter is operating properly. Realization of both the first and second pulses of energy and sensing of current ensures proper operation of all cells and diodes within the power converter. More specifically, with each pulse of energy, the IGBTs are ensured to operate properly, whereas with each non-gating interval, the diodes are ensured to operate properly. In addition, transferring energy pulses and sensing current-voltage feedbacks not only allows verification of the power filter components, but also implicitly verifies the bridge circuit operation.

The present subject matter has many advantages not present in the prior art. For example, in various embodiments, the present disclosure provides an automated system for testing a power converter that is installed as a subsystem of the overall renewable energy system so as to provide energy storage capabilities to the energy system. In further embodiments, the present subject matter supports research and development, manufacturing testing, diagnosis and repair, and/or field installations of various types of power converters, as subsystems of the overall energy system. Thus, the present disclosure provides standardized and consistent design and development practices, time savings, product differentiation through self-diagnosis, and increased value to commercial offerings.

Referring now to the drawings, FIG. 1 is a perspective view of a portion of an exemplary wind turbine 100 according to the present disclosure that is configured to implement the method and apparatus as described herein. The wind turbine 100 includes a nacelle 102 that typically houses a generator (not shown). The nacelle 102 is mounted on a tower 104 having any suitable height that facilitates operation of wind turbine 100 as described herein. The wind turbine 100 also includes a rotor 106 that includes three blades 108 attached to a rotating hub 110. Alternatively, the wind turbine 100 may include any number of blades 108 that facilitates operation of the wind turbine 100 as described herein.

Figure 2:
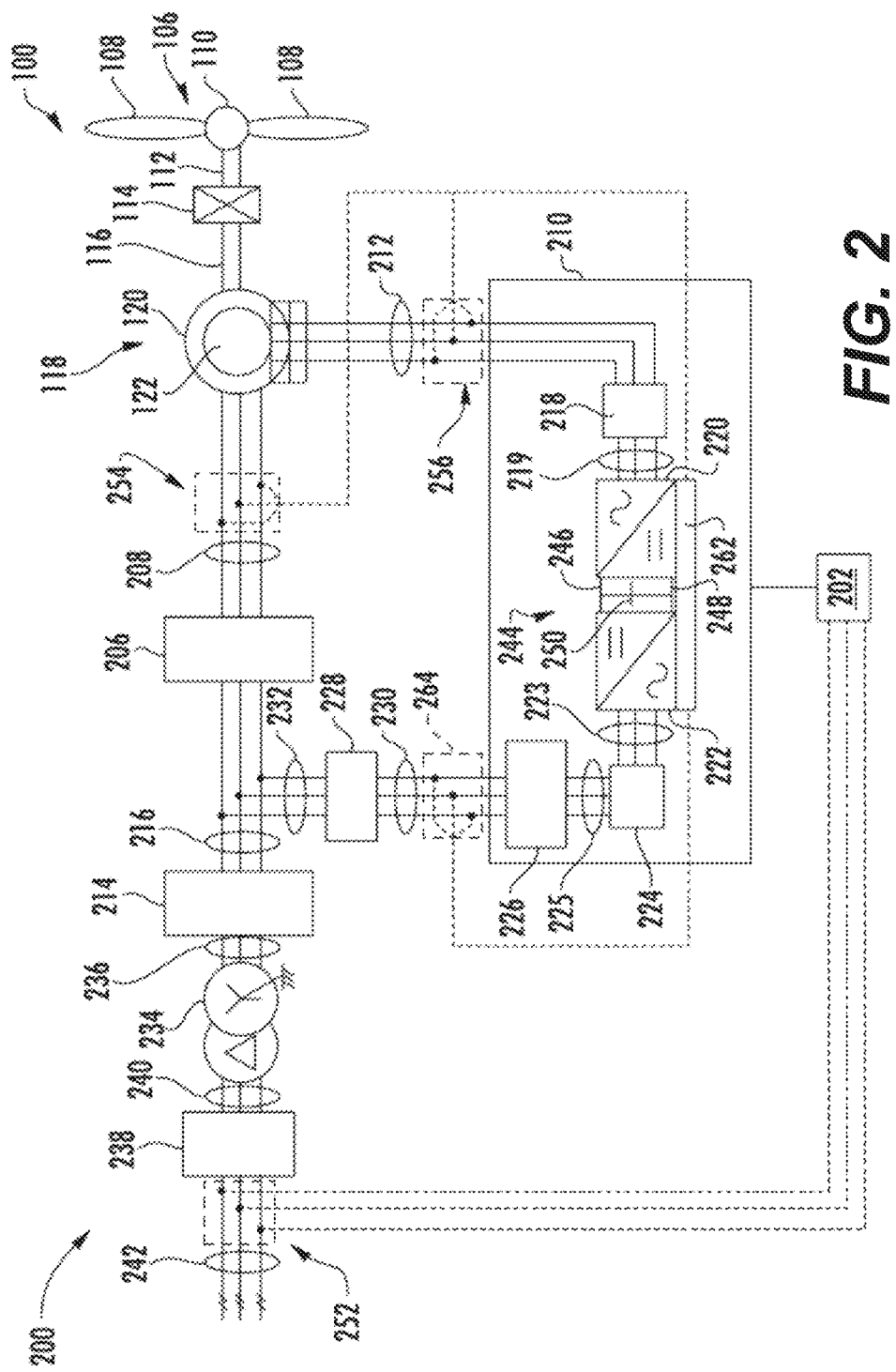
FIG. 2 illustrates a schematic view of one embodiment of an electrical and control system suitable for use with the wind turbine shown in FIG. 1.

Referring to FIG. 2, a schematic view of an exemplary electrical and control system 200 that may be used with the wind turbine 100 is illustrated. During operation, wind impacts the blades 108 and the blades 108 transform wind energy into a mechanical rotational torque that rotatably drives a low-speed shaft 112 via the hub 110. The low-speed shaft 112 is configured to drive a gearbox 114 that subsequently steps up the low rotational speed of the low-speed shaft 112 to drive a high-speed shaft 116 at an increased rotational speed. The high-speed shaft 116 is generally rotatably coupled to a generator 118 so as to rotatably drive a generator rotor 122. In one embodiment, the generator 118 may be a wound rotor, three-phase, double-fed induction (asynchronous) generator (DFIG) that includes a generator stator 120 magnetically coupled to a generator rotor 122. As such, a rotating magnetic field may be induced by the generator rotor 122 and a voltage may be induced within a generator stator 120 that is magnetically coupled to the generator rotor 122. In one embodiment, the generator 118 is configured to convert the rotational mechanical energy to a sinusoidal, three-phase alternating current (AC) electrical energy signal in the generator stator 120. The associated electrical power can be transmitted to a main transformer 234 via a stator bus 208, a stator synchronizing switch 206, a system bus 216, a main transformer circuit breaker 214, and a generator-side bus 236. The main transformer 234 steps up the voltage amplitude of the electrical power such that the transformed electrical power may be further transmitted to a grid via a breaker-side bus 240, a grid circuit breaker 238, and a grid bus 242.

Figure 3:
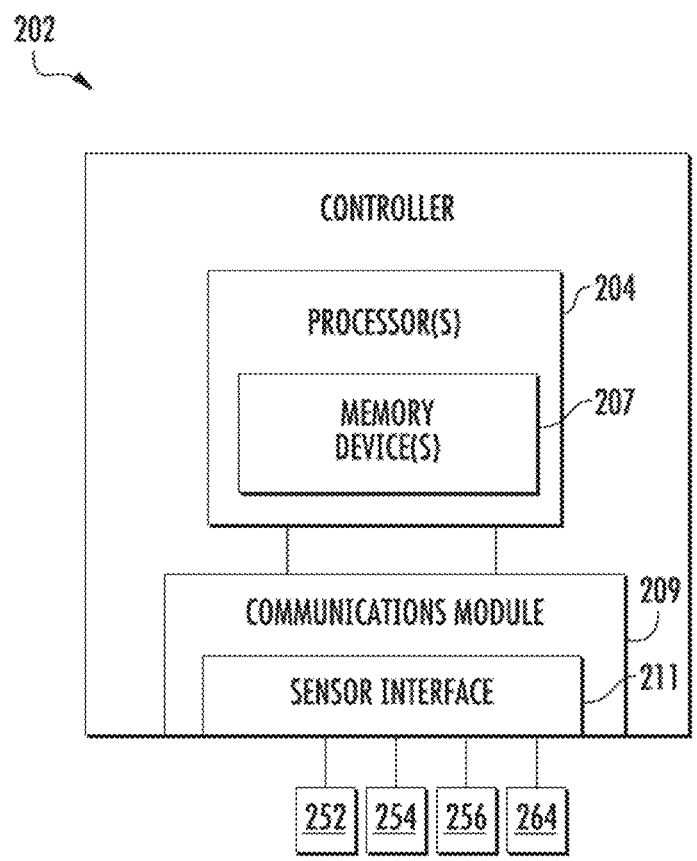
FIG. 3 illustrates a block diagram of one embodiment of a controller suitable for use with the wind turbine shown in FIG. 1.

In addition, the electrical and control system 200 may include a wind turbine controller 202 configured to control any of the components of the wind turbine 100. For example, as shown particularly in FIG. 3, the controller 202 may include one or more processor(s) 204 and associated memory device(s) 207 configured to perform a variety of computer-implemented functions (e.g., performing the methods, steps, calculations and the like and storing relevant data as disclosed herein). Additionally, the controller 202 may also include a communications module 209 to facilitate communications between the controller 202 and the various components of the wind turbine 100, e.g. any of the components of FIG. 2. Further, the communications module 209 may include a sensor interface 211 (e.g., one or more analog-to-digital converters) to permit signals transmitted from one or more sensors to be converted into signals that can be understood and processed by the processors 204. It should be appreciated that the sensors (e.g. sensors 252, 254, 256, 264) may be communicatively coupled to the communications module 209 using any suitable means. For example, as shown in FIG. 3, the sensors 252, 254, 256, 264 are coupled to the sensor interface 211 via a wired connection. However, in other embodiments, the sensors 252, 254, 256, 264 may be coupled to the sensor interface 211 via a wireless connection, such as by using any suitable wireless communications protocol known in the art. As such, the processor 204 may be configured to receive one or more signals from the sensors.

As used herein, the term "processor" refers not only to integrated circuits referred to in the art as being included in a computer, but also refers to a controller, a microcontroller, a microcomputer, a programmable logic controller (PLC), an application specific integrated circuit, and other programmable circuits. The processor 204 is also configured to compute advanced control algorithms and communicate to a variety of Ethernet or serial-based protocols (Modbus, OPC, CAN, etc.). Additionally, the memory device(s) 207 may generally comprise memory element(s) including, but not limited to, computer readable medium (e.g., random access memory (RAM)), computer readable non-volatile medium (e.g., a flash memory), a floppy disk, a compact disc-read only memory (CD-ROM), a magneto-optical disk (MOD), a digital versatile disc (DVD) and/or other suitable memory elements. Such memory device(s) 207 may generally be configured to store suitable computer-readable instructions that, when implemented by the processor(s) 204, configure the controller 202 to perform the various functions as described herein.

Referring back to FIG. 2, the generator stator 120 may be electrically coupled to a stator synchronizing switch 206 via a stator bus 208. In one embodiment, to facilitate the DFIG configuration, the generator rotor 122 is electrically coupled to a bi-directional power conversion assembly 210 via a rotor bus 212. Alternatively, the generator rotor 122 may be electrically coupled to the rotor bus 212 via any other device that facilitates operation of electrical and control system 200 as described herein. In a further embodiment, the stator synchronizing switch 206 may be electrically coupled to a main transformer circuit breaker 214 via a system bus 216.

The power conversion assembly 210 may include a rotor filter 218 that is electrically coupled to the generator rotor 122 via the rotor bus 212. A rotor filter bus 219 electrically couples the rotor filter 218 to a rotor-side power converter 220. Further, the rotor-side power converter 220 may be electrically coupled to a line-side power converter 222 via a single direct current (DC) link 244. Alternatively, the rotor-side power converter 220 and the line-side power converter 222 may be electrically coupled via individual and separate DC links. In addition, as shown, the DC link 244 may include a positive rail 246, a negative rail 248, and at least one capacitor 250 coupled therebetween.

In addition, a line-side power converter bus 223 may electrically couple the line-side power converter 222 to a line filter 224. Also, a line bus 225 may electrically couple the line filter 224 to a line contactor 226. Moreover, the line contactor 226 may be electrically coupled to a conversion circuit breaker 228 via a conversion circuit breaker bus 230. In addition, the conversion circuit breaker 228 may be electrically coupled to the main transformer circuit breaker 214 via system bus 216 and a connection bus 232. The main transformer circuit breaker 214 may be electrically coupled to an electric power main transformer 234 via a generator-side bus 236. The main transformer 234 may be electrically coupled to a grid circuit breaker 238 via a breaker-side bus 240. The grid circuit breaker 238 may be connected to the electric power transmission and distribution grid via a grid bus 242.

In operation, alternating current (AC) power generated at the generator stator 120 by rotation of the rotor 106 is provided via a dual path to the grid bus 242. The dual paths are defined by the stator bus 208 and the rotor bus 212. On the rotor bus side 212, sinusoidal multi-phase (e.g. three-phase) AC power is provided to the power conversion assembly 210. The rotor-side power converter 220 converts the AC power provided from the rotor bus 212 into DC power and provides the DC power to the DC link 244. Switching elements (e.g. IGBTs) used in bridge circuits of the rotor side power converter 220 can be modulated to convert the AC power provided from the rotor bus 212 into DC power suitable for the DC link 244.

The line side converter 222 converts the DC power on the DC link 244 into AC output power suitable for the electrical grid bus 242. In particular, switching elements (e.g. IGBTs) used in bridge circuits of the line side power converter 222 can be modulated to convert the DC power on the DC link 244 into AC power on the line side bus 225. The AC power from the power conversion assembly 210 can be combined with the power from the stator 120 to provide multi-phase power (e.g. three-phase power) having a frequency maintained substantially at the frequency of the electrical grid bus 242 (e.g. 50 Hz/60 Hz). It should be understood that the rotor-side power converter 220 and the line-side power converter 222 may have any configuration using any switching devices that facilitate operation of electrical and control system 200 as described herein.

Further, the power conversion assembly 210 may be coupled in electronic data communication with the turbine controller 202 and/or a separate or integral converter controller 262 to control the operation of the rotor-side power converter 220 and the line-side power converter 222. For example, during operation, the controller 202 may be configured to receive one or more voltage and/or electric current measurement signals from the first set of voltage and electric current sensors 252. Thus, the controller 202 may be configured to monitor and control at least some of the operational variables associated with the wind turbine 100 via the sensors 252. In the illustrated embodiment, each of the sensors 252 may be electrically coupled to each one of the three phases of grid bus 242. Alternatively, the sensors 252 may be electrically coupled to any portion of electrical and control system 200 that facilitates operation of electrical and control system 200 as described herein. In addition to the sensors described above, the sensors may also include a second set of voltage and electric current sensors 254, a third set of voltage and electric current sensors 256, a fourth set of voltage and electric current sensors 264 (all shown in FIG. 2), and/or any other suitable sensors.

It should also be understood that any number or type of sensors may be employed within the wind turbine 100 and at any location. For example, the sensors may be a Micro Inertial Measurement Units (MIMUs), strain gauges, accelerometers, pressure sensors, temperature sensors, angle of attack sensors, vibration sensors, Light Detecting and Ranging (LIDAR) sensors, camera systems, fiber optic systems, anemometers, wind vanes, Sonic Detection and Ranging (SODAR) sensors, infra lasers, radiometers, pitot tubes, rawinsondes, other optical sensors, and/or any other suitable sensors.

As mentioned, the system 200 may also include a converter controller 262 configured to receive one or more voltage and electric current measurement signals. For example, as shown in the illustrated embodiment, the converter controller 262 receives voltage and electric current measurement signals from the second set of voltage and electric current sensors 254 coupled in electronic data communication with stator bus 208. The converter controller 262 may also receive the third and fourth set of voltage and electric current measurement signals from the third and fourth set of voltage and electric current sensors 256, 264. In addition, the converter controller 262 may be configured with any of the features described herein in regards to the main controller 202. Further, the converter controller 262 may be separate from or integral with the main controller 202.

Figure 4:
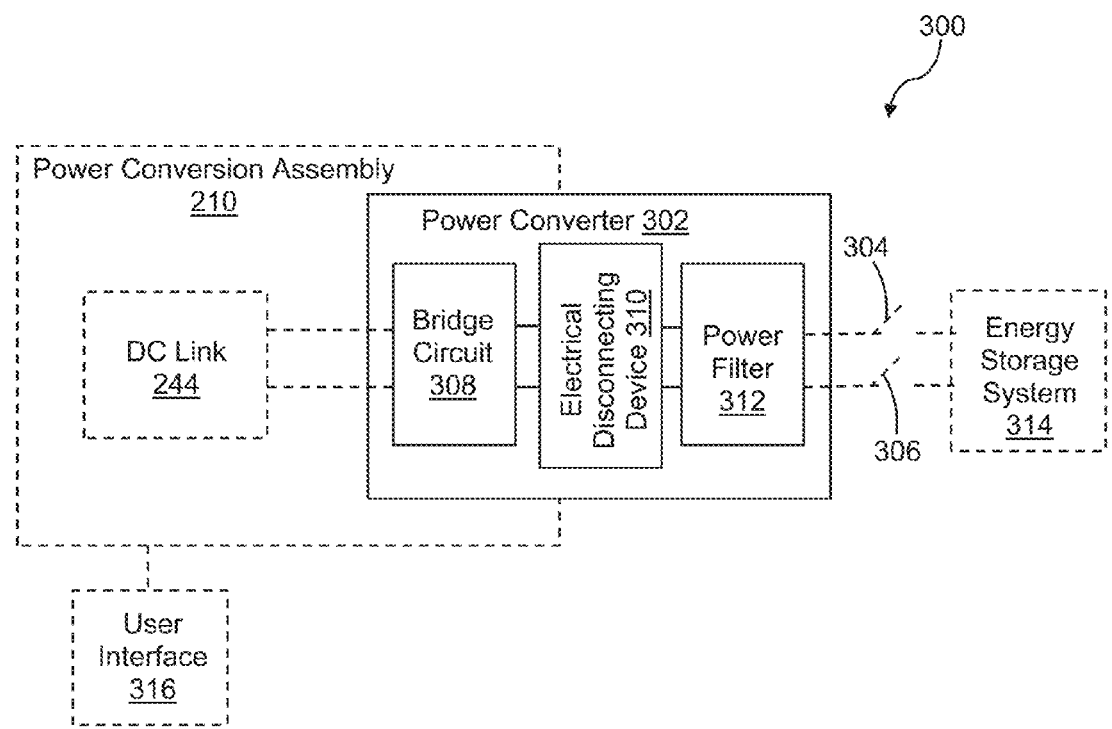
FIG. 4 illustrates a schematic diagram of one embodiment of an automated apparatus for testing a power converter according to the present disclosure.

Referring now to FIG. 4, one embodiment of an apparatus 300 for testing a power converter 302, e.g. a DC-DC power converter, according to the present disclosure is illustrated. As shown, the apparatus 300 includes the power converter 302 electrically coupled to the existing power conversion assembly 210 via the DC link 244. In addition, the power converter 302 has various electrical components, including, but not limited to a bridge circuit 308, one or more electrical disconnecting devices 310 (e.g. a breaker), and a power filter 312. Once the apparatus 300 successfully verifies performance of the power converter 302 (e.g. the power filter 312 and the bridge circuit 308), an energy storage system 314 (e.g. one or more battery modules) may be electrically connected to the existing power conversion assembly 210 by the power converter 302 via one or more switches 304, 306. It should be understood that the energy storage system 314 as described herein can include any energy storage device, such as a battery storage device, a fuel cell, a capacitor, one or more battery modules, or other suitable energy storage device. The apparatus 300 may also include a user interface 316 configured to actuate the power converter 302 and communicate a test diagnostic or sequence to a user. In various embodiments, the user interface 316 provides a user-friendly apparatus 300 and requires minimal user intervention such that the apparatus 300 is effectively automated.

Figure 5:
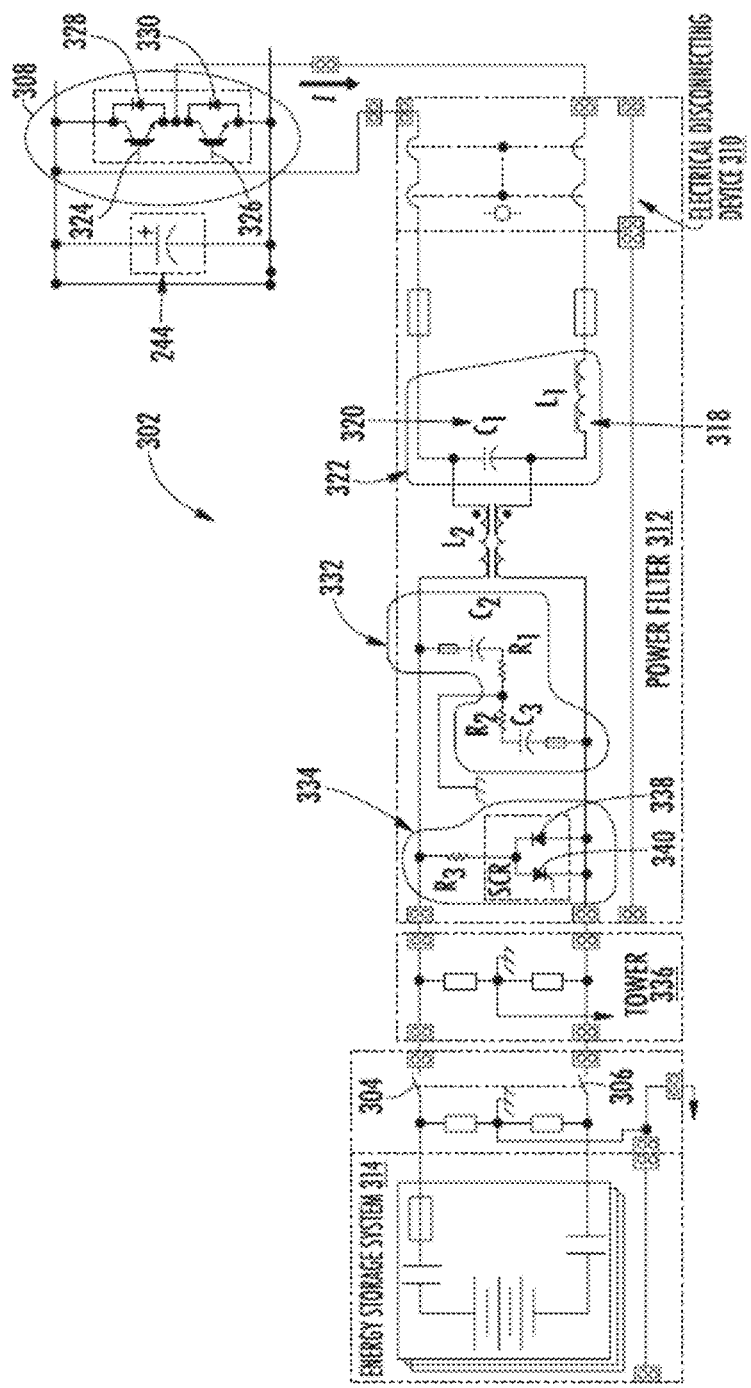
FIG. 5 illustrates a schematic diagram of one embodiment of various electrical components a power converter according to the present disclosure.

Referring now to FIG. 5, a more detailed schematic of one embodiment of the power converter 302 according to the present disclosure is illustrated. As shown, the power converter 302 includes bridge circuit 308, electrical disconnecting device 310, power filter 312, tower circuit 336, and energy storage system 314. The bridge circuit 308 generally includes one or more cells or cell arrangements. For example, in various embodiments, the bridge circuit 308 may include one or more first cells that are utilized during a first switching event of a test sequence and one or more second cells utilized during a second switching event of the test sequence. More specifically, as shown in the illustrated embodiment of FIG. 5, the first cells may include a first switching element 326 and a first diode 328, and the second cells may include a second switching element 324 and a second diode 330. In still further embodiments, the first and second cells may include any suitable switching elements and/or electrical components having any topology, including, but not limited to any one of or combination of the following: a diode, an IGBT, a relay, a silicon-controlled rectifier (SCR), a thyristor, a triode for alternating current (TRIAC), a metal-oxide-semiconductor field effect transistor (MOSFET), a junction gate field-effect transistor (JFET), a bipolar junction transistor (BJT), an integrated-gate commutated thyristor (IGCT), a gate turn-off thyristor (GTO), a MOS-controlled thyristor (MCT), a static induction transistor and thyristor (SIT), or similar. For example, as shown, the bridge circuit 308 includes first IGBT 326, first diode 328, second IGBT 324, and second diode 330. The IGBTs as described herein are generally three-terminal power semiconductor devices that are primarily used as an electronic switch. More specifically, the IGBTs generally have a gate, a collector, and an emitter. In addition, the bridge circuit 308 may include any number of switching elements and/or electrical components.

Still referring to FIG. 5, the power filter 312 generally includes a RLC circuit, which is understood in the art to encompass an electrical circuit having one or more resistive elements (e.g. $R_1$ and $R_2$), one or more inductive elements (e.g. $L_1$ and $L_2$), and one or more capacitive elements (e.g. $C_1$, $C_2$, and $C_3$), connected in series or parallel. More specifically, as shown, the power filter 312 may include a dominant capacitor 320 (corresponding to $C_1$) and a dominant inductor 318 (corresponding to $L_1$) as part of a dominant LC circuit 322. In addition, the power filter 312 may also include any number of additional inductive elements, capacitive elements, and resistive elements. For example, as shown, the power filter includes inductive element $L_2$ that connects the dominant LC circuit 322 to a secondary RC circuit 332. More specifically, the secondary RC circuit 332 includes a plurality of resistive elements (i.e. $R_1$ and $R_2$) and a plurality of capacitive elements (i.e. $C_2$ and $C_3$) connected in series.

In addition, the power filter 312 may also include a crowbar circuit 334. The crowbar circuit 334 generally includes one or more resistive elements (e.g. $R_3$), a voltage-controlled switching element, and an anti-parallel diode. More specifically, in certain embodiments, the voltage-controlled switching element may include a silicon-controlled rectifier (SCR) or a semiconductor-controlled rectifier. SCRs are generally unidirectional (i.e. can conduct current only in one direction) devices or thyristors that typically include an anode, a cathode, and a gate. Further, SCRs can be triggered normally only by currents going into the gate, but that typically only turn off when current in the circuit goes to zero. The resistive element $R_3$ is configured to limit current between the two nodes of the SCR.

During operation, the apparatus 300 implements a test sequence to test each of the cells in the bridge circuit 308 and/or the components of the power filter 312. More specifically, the test sequence provides a series of controlled gating intervals or pulses of energy via the DC link 244 to the power converter 302, with the objective of testing each cell of the bridge circuit 308 and analyzing passive components that make up the power filter 312. Each gating interval includes current and/or voltage feedbacks that are analyzed in real-time or stored and post-processed to verify proper switching operation of the power converter 302 and to confirm that components of the power filter 312 are within acceptable tolerance ranges. Testing of the cells within the bridge circuit 308 requires current flowing into and out of the power converter 302. Thus, in one embodiment, the apparatus 300 performs one or more switching events and interleaves periods of gating inactivity to test the power converter 302 components. The periods of gating inactivity or non-gating intervals induce natural commutations in the bridge circuit 308 and the retention or recovery of energy inside the power filter 312. Transferring energy pulses and sensing current-voltage feedbacks allows verification of the power filter 312 components and also provides implicit verification of the bridge circuit 308 cells.

Figure 6:
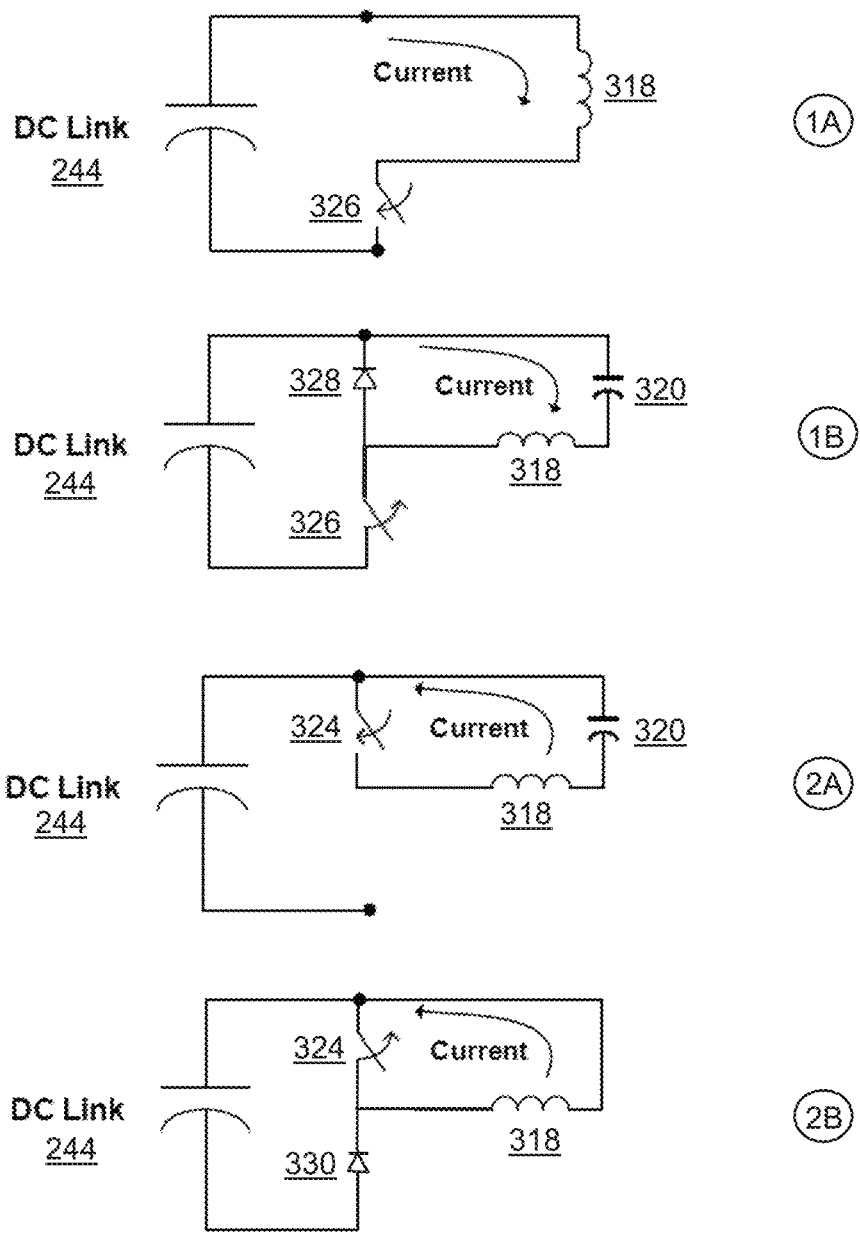
FIG. 6 illustrates a simplified, schematic diagram of one embodiment of various components of a bridge circuit of the power converter during a test sequence according to the present disclosure.

Referring to FIG. 6, a simplified, schematic diagram of various components of the bridge circuit 308 of the power converter 302 during the test sequence of the present disclosure are illustrated. As shown, a first switching event or gating interval (as indicated by the number 1A) transfers a first pulse of energy from the DC Link 244 to the dominant inductive element 318 (i.e. $L_1$) of the power filter 312 through the first IGBT 326 of the bridge circuit 308. The apparatus 300 then implements a subsequent non-gating period (as indicated by the number 1B) that allows all or a portion of the energy from the first pulse into the dominant capacitive element 320 (i.e. $C_1$) of the power filter 312 through the first diode 328 of the bridge circuit 308. The expected power flow during the first switching event of the test sequence is only obtained if all involved cells of the bridge circuit 308 are working properly and the electrical disconnecting device 310 allows for a continuous flow of current. Thus, the apparatus 300 can analyze a transient response of developed current within the bridge circuit 308 combined with a final steady-state voltage to determine a first current-voltage feedback. In certain embodiments, the first current-voltage feedback typically includes a first charge and a first flux of the first pulse of energy. More specifically, in further embodiments, the apparatus 300 is configured to express these initial findings in terms of inductance and capacitance values that can be directly checked against nominal tolerances for the power converter 302, as is discussed in more herein.

Still referring to FIG. 6, a second switching event or gating interval (as indicated by the number 2A) transfers a second pulse of energy from the capacitive element 320 to the inductive element 318 through a second switching element (i.e. the second IGBT 324) within the bridge circuit 308 such that at least a portion of the first pulse of energy within the capacitive element 320 moves back to the inductive element 318, thereby reclaiming all or a portion of the energy from the first pulse. The apparatus 300 then implements a second non-gating period (as indicated by the number 2B) such that at least a portion of the first pulse of energy within the inductive element 318 moves back to the DC link 244 through a second diode 330. Similar to the first switching event, a second current-voltage feedback associated with the second pulse of energy is determined. Further, the second current-voltage feedback typically includes a second charge and a second flux of the second pulse of energy. Thus, the second charge and the corresponding flux at which it occurs are checked against the results from the first pulse, within expected or nominal tolerances of the power filter 312. The apparatus 300 then compares the first and second current-voltage feedbacks with the nominal tolerances of the power converter 302, e.g. the power filter 312, to ensure that the power converter 302 is operating properly. As mentioned, the current-voltage feedbacks provide verification of the power filter 312 and also provide implicit verification of the bridge circuit 308. After the test sequence is complete, in various embodiments, the power converter 302 exhibits almost the same energy state that was present before gating its cells, where typical divergence can be attributed to time gating resolution, component tolerances, and/or losses.

It should be understood that the switching events as described herein may be sized such that safe operation of the power converter 302 is maintained, while symmetrically probing power flow between the bridge circuit 308 and the power filter 312. For example, in one embodiment, the apparatus 300 utilizes converter ratings and/or nameplate values of one or more components of the power filter 312 to size the switching events. More specifically, in various embodiments, the switching events are designed such that a maximum current is not exceeded within the cells of the bridge circuit 308 and/or the power filter 312.

Figure 7:
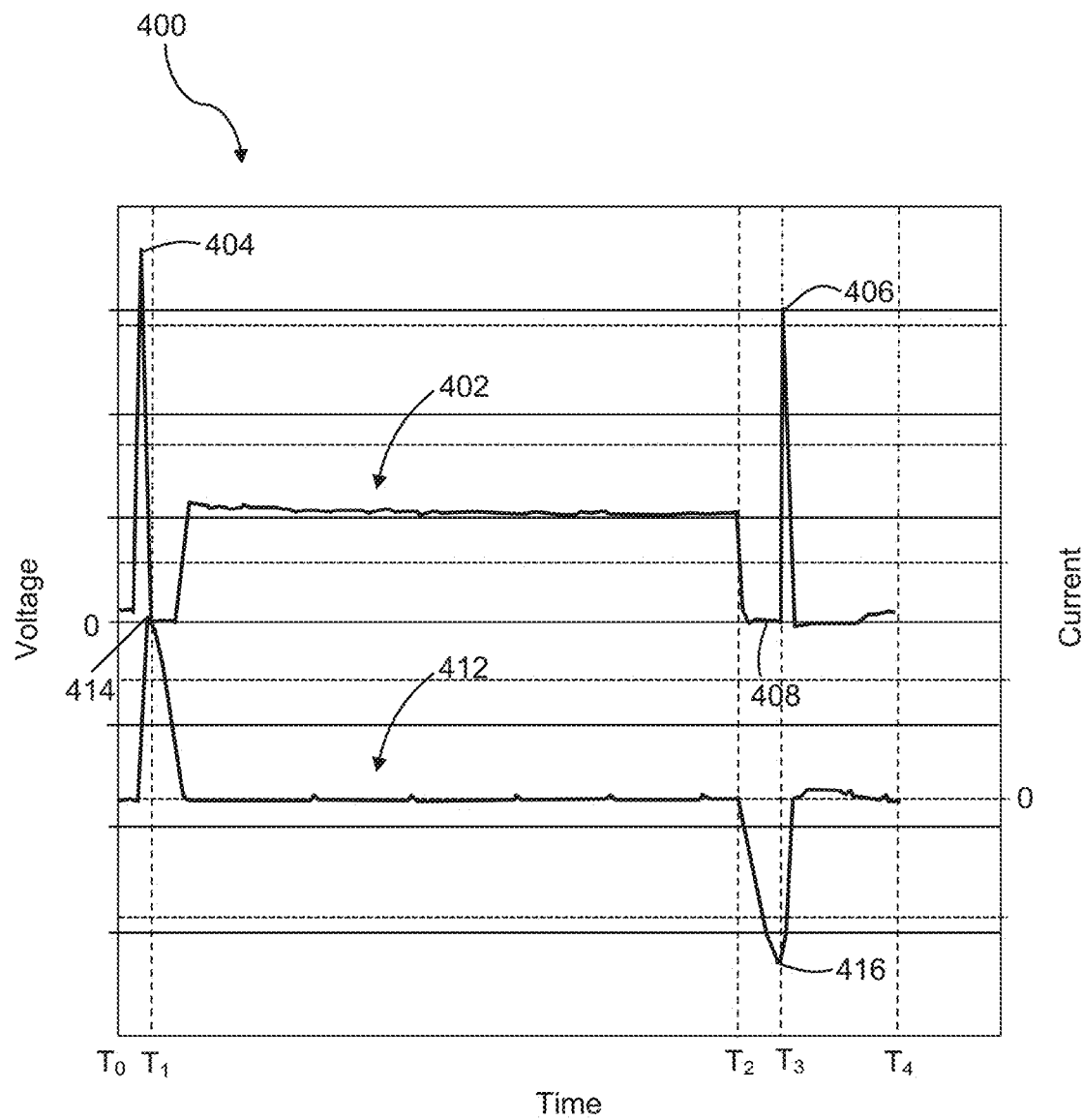
FIG. 7 illustrates a graph of test results from the test sequence of FIG. 6.

Referring now to FIG. 7, one embodiment of a graph 400 of test results captured during a test sequence of the power converter 302 is illustrated. More specifically, the graph 400 illustrates voltage versus time (curve 402) and current versus time (curve 412) during the test sequence according to the present disclosure. In the illustrated embodiment, the apparatus 300 performs the test sequence on a single phase DC-DC converter connected to a DC link 244 of a back-to-back wind power converter, though those of ordinary skill in the art will understand that the illustrated embodiment is for illustrative purposes only and the test sequence may be performed on any type of power converter for any type of energy system. As shown, the first switching event (or first gating interval) starts at time $T_0$ and ends at time $T_1$. As mentioned, the first gating interval transfers a first pulse of energy (as indicated by voltage peak 404) from the DC Link 244 to the dominant inductive element 318 of the power filter 312 through the first IGBT 326 of the bridge circuit 308.

At time $T_1$, the apparatus 300 implements the first non-gating period (e.g. from $T_1$ to $T_2$) that allows all or a portion of the energy from the first pulse from the dominant inductive element 318 into the dominant capacitive element 320 through the first diode 328 within the bridge circuit 308. At time $T_2$, the apparatus 300 implements the second switching event or gating interval (as indicated by voltage valley 408), which ends at time $T_3$. As shown, the current 412 that corresponds to the first and second switching events (as indicated by peaks 414 and 416) are substantially symmetrical, but in opposite directions, indicating that the energy from the second switching event is substantially directed through cells that were gated and naturally commutated during the first non-gating period. In addition, time $T_4$ represents an end to the test sequence. Thus, as shown in the illustrated embodiment, the end of the test sequence leaves the power converter 302 having substantially the same conditions that existed prior to the test sequence.

Figure 8:
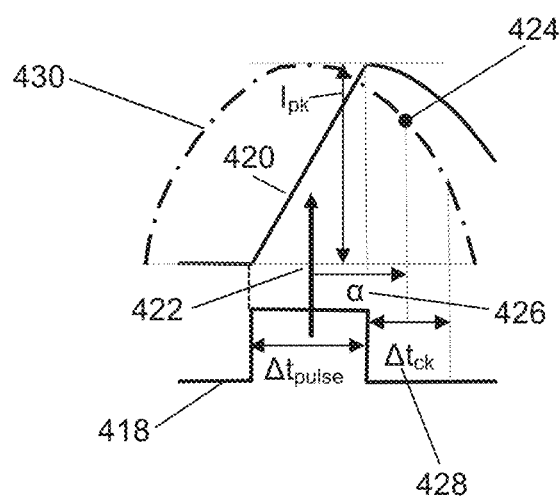
FIG. 8 illustrates a graphical representation of calculating a peak current during the test sequence of FIG. 6; and, FIG. 9 illustrates a flow diagram of one embodiment of a method for testing a power converter according to the present disclosure.

As mentioned, the apparatus 300 is configured to express the first and second current-voltage feedbacks from the test sequence in terms of inductance and capacitance values that can be directly checked against nominal tolerances for the power converter 302. As such, the apparatus 300 is configured to calculate a peak current $I_{pk}$ that is reached during one or more of the gating intervals (e.g. between $T_0$ and $T_1$ and between $T_2$ and $T_3$). For example, referring now to FIG. 8, a graphical representation of calculating the peak current during the test sequence is illustrated. As shown, the apparatus 300 calculates the peak current $I_{pk}$ by idealizing the applied voltage pulse 418 as an impulse function 422 and adjusting the maximum sampled current feedback 424 according to its phase displacement 426 (represented in FIG. 8 by the symbol $\alpha$). The phase displacement $\alpha$ comes from solving and evaluating the theoretical natural frequency $\omega$ of a second-order differential system 430, dominated by a serial connection of the dominant capacitive and inductive elements 318, 320 of the power filter 312. For example, in the illustrated embodiment, the second-order series LC natural frequency $\omega$ is represented by Equation (1) below:

$$\omega = \frac{1}{\sqrt{LC}} \qquad \text{Equation (1)}$$

In addition, in certain embodiments, the phase displacement $\alpha$ may be calculated using Equation (2) below:

$$\alpha = \frac{\Delta t_{pulse} + \Delta t_{ck}}{2} \omega \qquad \text{Equation (2)}$$

where $\Delta t_{pulse}$ is the time of the pulse;
$\Delta t_{ck}$ is the sampling period; and
$\omega$ is the theoretical natural frequency.
Knowing the phase displacement $\alpha$ from Equation (2) above, in various embodiments, the peak current $I_{pk}$ can be calculated according to Equation (3) below:

$$I_{pk} = \frac{1}{\cos(\alpha)} I_{Max-Sample} \qquad \text{Equation (3)}$$

where $I_{Max-Sample}$ is the maximum current sample, which is generally equal to the average current over the sampling period that exhibited more current (i.e. $\Delta t_{ck}$).

This first method for calculating the peak current $I_{pk}$ is beneficial because as little as one current sample is needed to determine the peak current $I_{pk}$. In alternative embodiments, the peak current $I_{pk}$ can be determined using a second, different method that includes estimating the triangular area under the ramping current while the voltage pulse is being applied. More specifically, in one embodiment, the peak current $I_{pk}$ may be obtained using Equation (4) below:

$$I_{pk} = 2 \frac{\text{Triangular Area Under Current}}{\Delta t_{pulse}} \qquad \text{Equation (4)}$$

In contrast to the first method for calculating the peak current $I_{pk}$, the second method requires more current samples (e.g. preferably as many samples as the data acquisition system can collect before the voltage pulse is over), since such samples provide the triangular area under the ramping current. It should be understood that the peak current $I_{pk}$ may further be calculated using any other suitable methods and/or calculations now known or later developed in the art.

The apparatus 300 can then calculate a flux measurement ($\Phi$) of the dominant inductive element 318 ($L_1$) when current increases from time $T_0$ to the peak current 414 (i.e. the calculated $I_{pk}$ from above) and the DC link 244 voltage appears across the power filter 312. In certain embodiments, for example, a parasitic lumped resistance and a slowly increasing voltage (i.e. with respect to the increasing current) across a nominal capacitive element (i.e. $C_{nom}$) are used to compensate for volt-seconds in areas of the power filter 312 other than the dominant inductive element 318. In further embodiments, a real, derived capacitance value may be used as estimated from feedback values obtained during the testing sequence. More specifically, in one embodiment, the flux measurement $\Phi$ may be obtained using Equation (5) below:

$$\Phi_{inductor} = \qquad \text{Equation (5)}$$
$$V_{dc} * \Delta t_{pulse} - \int_0^{t_{pulse}} i(t) * R \, dt - \frac{1}{C_{nom}} \int_0^{t_{pulse}} Q(t) dt$$

where $V_{dc}$ is the DC link 244 voltage;
$\Phi_{inductor}$ is the flux measurement of the inductive element 318;
$\Delta t_{pulse}$ is the time of the pulse;
i is the current;
R is the resistance;
t is time;
$C_{nom}$ is the capacitance across the nominal capacitive element; and
Q(t) is the charge into the capacitive element as determined by the area under the current curve 412.

In certain embodiments, the area under the current, Q(t), is approximated by Equation (6) below:

$$\int_0^{t_{pulse}} Q(t)dt \approx \text{Area Under Current} * \frac{\Delta t_{pulse}}{3} \quad \text{Equation (6)}$$

The apparatus 300 then calculates an inductance value and compares the calculated value to a nominal value within an acceptable tolerance for the power converter 302. For example, in one embodiment, the inductance value is calculated using the Equation (7) below:

$$L = \frac{\Phi_{inductor}}{I_{pk}} \quad \text{Equation (7)}$$

In various embodiments, if the current stops flowing in any of the cells being tested in the bridge circuit 308, then the voltage across the capacitive element 320 is revealed through feedback samples. Thus, the presence of suitable capacitance levels can be verified by recognizing that the dominant capacitive element 320 receives a majority of the electrical charge while the cells are being gated. More specifically, in one embodiment, the apparatus 300 is configured to determine a capacitance of the dominant capacitive element 320 using Equation (8) below:

$$C_{dominant} = \frac{Q_{pulse}}{V_{c(sampled\ when\ i=0)}} \quad \text{Equation (8)}$$

where $Q_{pulse}$ is the area under the current pulse.

In addition, in certain embodiments, a subsequent static charge balance must occur between all parallel connected capacitor elements. Thus, in various embodiments, the capacitance across all capacitive elements can be determined using Equation (9) below:

$$C_{total} = \frac{Q_{pulse}}{V_{c(steady\ state)}} \quad \text{Equation (9)}$$

The time constant associated with transferring charge from the dominant capacitive element 320 to additional capacitive elements (i.e. $C_2$ and $C_3$), which directly depends on the resistive elements ($R_1$ and $R_2$) of the power filter 312 is used to validate the duration of charge flow until a steady state is reached. Testing of the capacitive elements is then completed by determining whether the dominant capacitance ($C_{dominant}$) is within an acceptable tolerance and whether a tolerable positive difference exists between the total and the dominant capacitive values within expected time.

Figure 9:
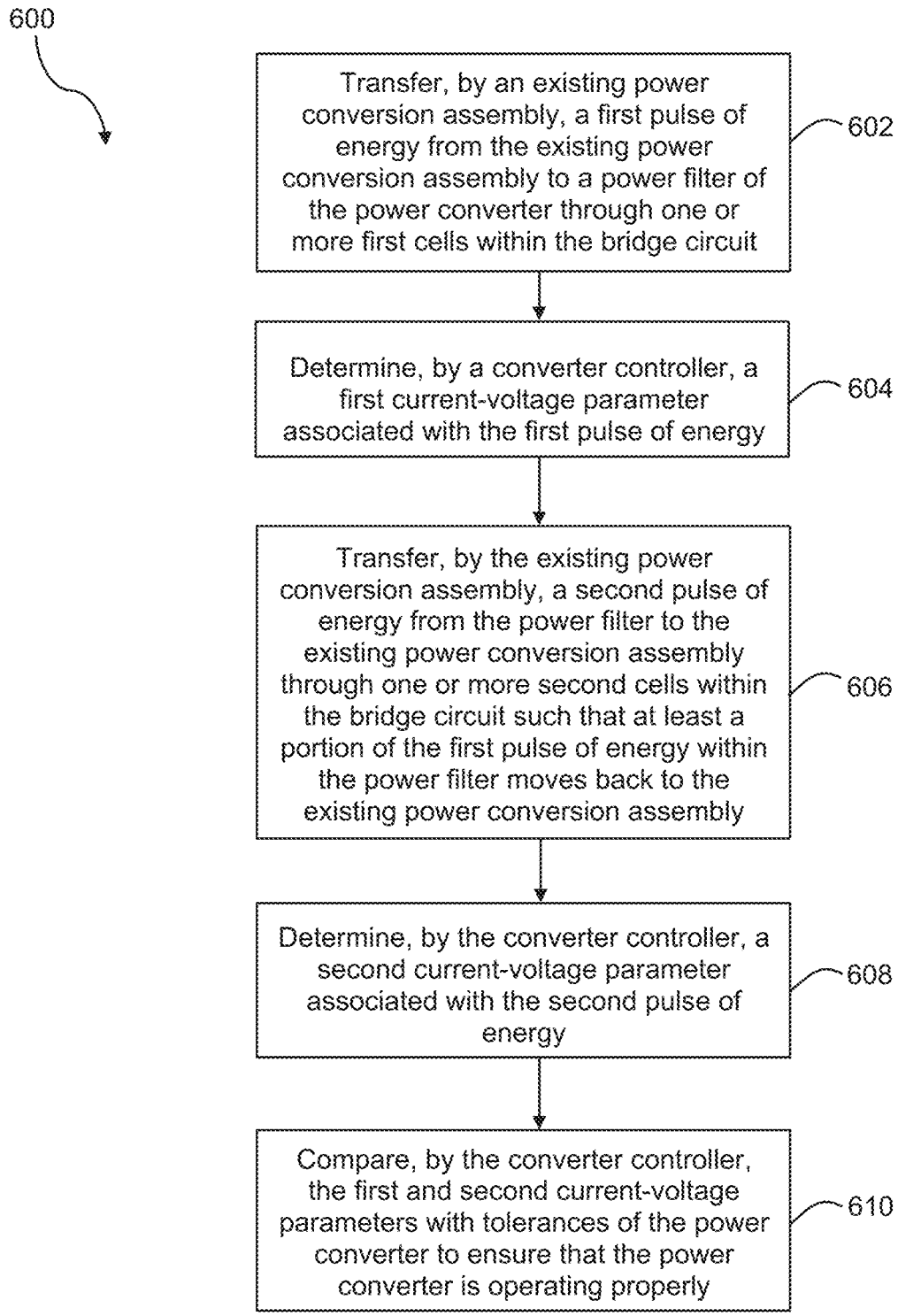

Referring now to FIG. 9, a flow diagram of one embodiment of a method 600 for testing operability of a power converter with an existing power conversion assembly of a renewable energy system is illustrated. As shown, the method 600 includes a step 602 of transferring a first pulse of energy from the existing power conversion assembly to the power filter through one or more first cells within the bridge circuit to ensure the one or more first cells are operating properly. Still an additional step 604 includes determining a first current-voltage feedback associated with the first pulse of energy. The method also includes transferring a second pulse of energy from the power filter to the existing power conversion assembly through one or more second cells within the bridge circuit such that at least a portion of the first pulse of energy within the power filter moves back to the existing power conversion assembly (step 606) to ensure that the one or more second cells are operating properly. A next step 608 includes determining a second current-voltage feedback associated with the second pulse of energy. The method 600 also includes comparing the first current-voltage feedback and the second current-voltage feedback with nominal tolerances of the power converter to ensure that the power converter is operating properly (step 610).

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A method for testing operability of a power converter with an existing power conversion assembly of a renewable energy system, the power converter having a bridge circuit and a power filter, the method comprising:

transferring, by the existing power conversion assembly, a first pulse of energy from the existing power conversion assembly to the power filter through one or more first cells within the bridge circuit, wherein the first cells of the bridge circuit comprise a first switching element and a first diode, and wherein the first pulse of energy is transferred to an inductive element of the power filter through the first switching element of the bridge circuit;

determining, by a converter controller, a first current-voltage feedback associated with the first pulse of energy;

transferring, by the existing power conversion assembly, a second pulse of energy from the power filter to the existing power conversion assembly through one or more second cells within the bridge circuit such that at least a portion of the first pulse of energy within the power filter is included in the second pulse of energy, wherein the second cells of the bridge circuit comprise a second switching element and a second diode;

determining, by the converter controller, a second current-voltage feedback associated with the second pulse of energy; and, comparing, by the converter controller, the first and second current-voltage feedbacks with tolerances of the power converter to ensure that the power converter is operating properly.

2. The method of claim 1, wherein the first and second cells comprise any one of or combination of the following: a diode, an insulated-gate bipolar transistor (IGBT), a relay, a silicon-controlled rectifier (SCR), a thyristor, a triode for alternating current (TRIAC), a metal-oxide-semiconductor field effect transistor (MOSFET), a junction gate field-effect transistor (JFET), a bipolar junction transistor (BJT), an integrated-gate commutated thyristor (IGCT), a gate turn-off thyristor (GTO), a MOS-controlled thyristor (MCT), or a static induction transistor and thyristor (SIT).

3. The method of claim 1, further comprising implementing a first non-gating interval such that at least a portion of the first pulse of energy is directed from the inductive element of the power filter into a capacitive element of the power filter through the first diode of the bridge circuit.

4. The method of claim 3, wherein determining the first current-voltage feedback associated with the first pulse of energy further comprises:
   determining a first flux measurement of the inductive element of the power filter based on a developed current of the inductive element, a steady-state voltage of the power filter, and a first charge for the first pulse of energy;
   determining a first inductance measurement of the power filter based on the first flux measurement and the developed current of the inductive element; and,
   determining a first capacitance measurement of the power filter based on the first charge and the steady-state voltage of the power filter.

5. The method of claim 4, wherein the second pulse of energy includes at least a portion of the first pulse of energy within the power filter such that during transferring, the second pulse of energy including at least a portion of the first energy moves from the capacitive element of the power filter to the inductive element through the second switching element within the bridge circuit.

6. The method of claim 5, further comprising implementing a second non-gating interval such that the second pulse of energy including at least a portion of the first pulse of energy within the inductive element moves to the existing power conversion assembly through the second diode within the bridge circuit.

7. The method of claim 6, wherein determining the second current-voltage feedback associated with the second pulse of energy further comprises:
   determining a second flux measurement of the inductive element of the power filter based on a developed current of the inductive element, a steady-state voltage of the power filter, and a second charge for the second pulse of energy;
   determining a second inductance measurement of the power filter based on the second flux measurement and the developed current of the inductive element; and,
   determining a second capacitance measurement of the power filter based on the second charge and the voltage of the power filter.

8. The method of claim 7, further comprising comparing the first and second inductance measurements and the first and second capacitance measurements of the power filter with tolerances of the power converter to ensure that the power converter is performing within the tolerances.

9. The method of claim 1, wherein comparing the first current-voltage feedback and the second current-voltage feedback with tolerances of the power converter to ensure that the power converter is operating properly further comprises:
   comparing the first and second current-voltage feedbacks with tolerances of the power filter; and
   based on the comparison, determining whether the bridge circuit is operating properly.

10. A method for coupling one or more energy storage devices to an existing power conversion assembly of a renewable energy system via a power converter, the power converter having a bridge circuit and a power filter, the method comprising:
   implementing, by a converter controller, a test sequence for testing operability of the power converter with the existing power conversion assembly, wherein the test sequence comprises:
      transferring, by the existing power conversion assembly, a first pulse of energy from the existing power conversion assembly to the power filter through one or more first cells within the bridge circuit, the first cells of the bridge circuit comprising a first switching element and a first diode, the first pulse of energy being transferred to an inductive element of the power filter through the first switching element,
      determining, by the converter controller, a first current-voltage feedback associated with the first pulse of energy,
      transferring, by the existing power conversion assembly, a second pulse of energy from the power filter to the existing power conversion assembly through one or more second cells within the bridge circuit such that at least a portion of the first pulse of energy within the power filter is included in the second pulse of energy, the one or more second cells comprising a second switching element and a second diode,
      determining, by the converter controller, a second current-voltage feedback associated with the second pulse of energy,
      comparing, by the converter controller, the first and second current-voltage feedbacks with tolerances of the power converter to ensure that the power converter is operating properly, and
      electrically coupling one or more energy storage devices with the power converter when the first and second current-voltage feedbacks are within the tolerances.

11. The method of claim 10, wherein the first cells of the bridge circuit comprise a first switching element and a first diode, and wherein the second cells of the bridge circuit comprise a second switching element and a second diode.

12. An apparatus for testing operability of a power converter with an existing power conversion assembly of a renewable energy system, the apparatus comprising:
   the power converter electrically coupled with the existing power conversion assembly, the power converter comprising a bridge circuit and a power filter, the bridge circuit comprising one or more first cells and one or more second cells; and,
   a converter controller communicatively coupled to the power converter and the existing power conversion assembly, the converter controller configured to perform a plurality of operations of the power converter and the existing power conversion assembly, the operations comprising:
      transferring a first pulse of energy from the existing power conversion assembly to the power filter through one or more first cells within the bridge circuit, the first cells of the bridge circuit comprising a first switching element and a first diode, the first pulse of energy being transferred to an inductive element of the power filter through the first switching element;
      determining a first current-voltage feedback associated with the first pulse of energy;
      transferring a second pulse of from the power filter to the existing power conversion assembly through one or more second cells within the bridge circuit such that at least a portion of the first pulse of energy within the power filter is included in the second pulse of energy, the one or more second cells comprising a second switching element and a second diode;
      determining a second current-voltage feedback associated with the second pulse of energy; and, comparing the first current-voltage feedback and the second current-voltage feedback with tolerances of the power converter to ensure that the power converter is operating properly.

13. The apparatus of claim 12, further comprising one or more energy storage devices configured with the power converter.

14. The apparatus of claim 12, wherein the power converter further comprises an electrical disconnecting device configured between the bridge circuit and the power converter.

15. The apparatus of claim 12, wherein the power converter comprises a DC-DC power converter.

16. The apparatus of claim 12, further comprising a user interface configured to actuate the power converter and communicate a test diagnostic to a user.

17. The apparatus of claim 12, wherein the power converter is electrically coupled to a DC link of the existing power conversion assembly.

* * * * *